(12) United States Patent
Tung et al.

(10) Patent No.: US 6,556,056 B1
(45) Date of Patent: *Apr. 29, 2003

(54) METHOD AND APPARATUS FOR USING PARASITIC EFFECTS IN PROCESSING HIGH SPEED SIGNALS

(75) Inventors: John C. Tung, Cupertino, CA (US); Minghao (Mary) Zhang, Cupertino, CA (US)

(73) Assignee: Qantec Communications, Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/118,733

(22) Filed: Apr. 8, 2002

Related U.S. Application Data

(63) Continuation-in-part of application No. 09/947,643, filed on Sep. 5, 2001, now Pat. No. 6,433,595.

(51) Int. Cl.$^7$ .............................................. H03K 21/00
(52) U.S. Cl. ...................................................... 327/115
(58) Field of Search ................................. 327/113, 115, 327/117, 200, 201, 208, 210–215, 218, 219; 377/47

(56) References Cited

U.S. PATENT DOCUMENTS

| | | | |
|---|---|---|---|
| 4,289,979 A | | 9/1981 | Muller ........................ 327/204 |
| 5,534,811 A | | 7/1996 | Gist et al. .................... 327/304 |
| 5,844,437 A | * | 12/1998 | Asazawa et al. |
| 6,094,466 A | * | 7/2000 | Yang et al. .................... 377/47 |
| 6,097,873 A | * | 8/2000 | Monk .......................... 327/156 |
| 6,140,845 A | * | 10/2000 | Benachour |
| 6,166,571 A | * | 12/2000 | Wang ......................... 327/115 |
| 6,249,157 B1 | * | 6/2001 | Nakura et al. ............... 327/115 |

FOREIGN PATENT DOCUMENTS

| | | |
|---|---|---|
| EP | 89306979.9 | 1/1990 |
| JP | 60-012819 | 1/1985 |

OTHER PUBLICATIONS

Sharaf & Elmasry, "Analysis and optimization of series—Gated CML and ECL high–speed bipolar circuits," IEEE Journal on Solid–state circuits, vol. 31, No. 2, Feb. 1996, pp. 202–211.

* cited by examiner

*Primary Examiner*—My-Trang Nuton
(74) *Attorney, Agent, or Firm*—Joe Zheng; C. P. Chang

(57) ABSTRACT

A method of designing an electronic circuit system with multiple Field Effect Transistors (FETs) made by a variety of nonstandard industrial processes is presented. With this method, the circuit parameters of the various components of the individual functional building blocks of the circuit system are systematically adjusted to minimize the many deteriorating effects resulting from system-level interactions among these functional building blocks. In one embodiment, the method is applied to a Silicon On Insulator (SOI) CMOS IC that is a Divide-by-16 divider where the functional building blocks are four Divide-by-2 dividers. The resulting drastic improvement of output signal ripple from each divider stage is graphically presented. In another embodiment, the method is applied to another SOI CMOS IC that is a Bang Bang Phase Detector where the functional building blocks are three Master Slave D-Type Flip Flops. The resulting drastic improvement of output signal ripple is also graphically presented.

22 Claims, 12 Drawing Sheets

Remark: CLK = Logic Inversion of CLK, etc.

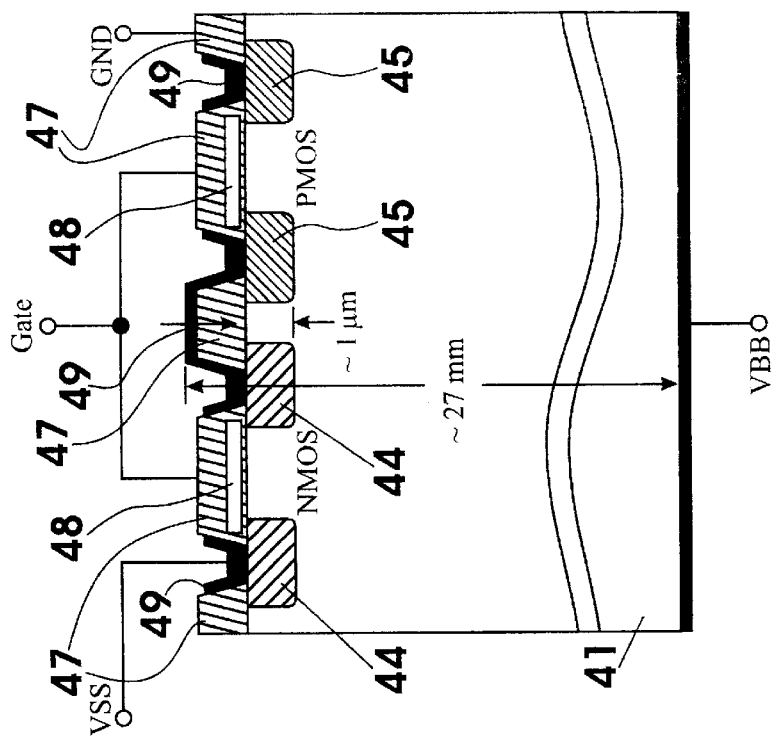
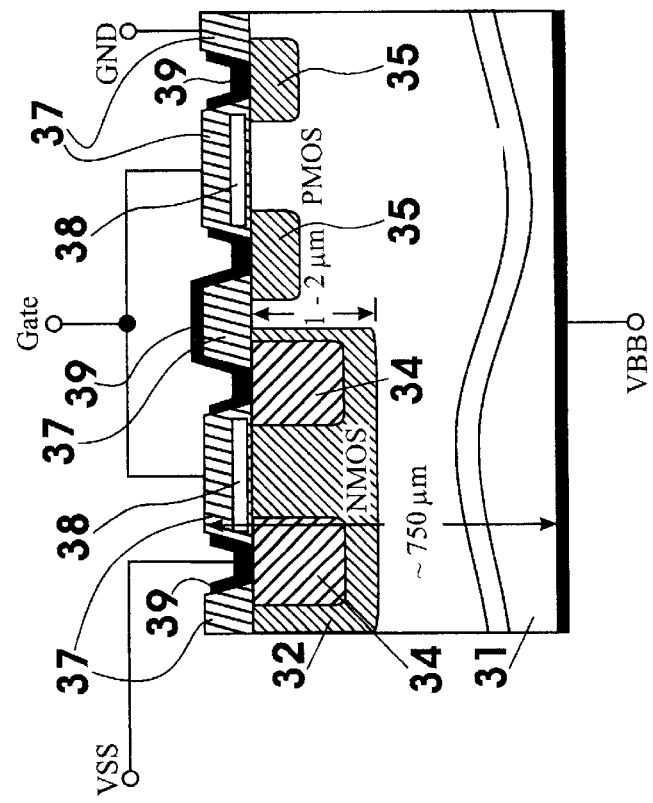
Fig. 2C  Standard CMOS Structure    Fig. 2D  CMOS on SOI Structure

Fig. 2E  Standard CMOS Capacitance Model
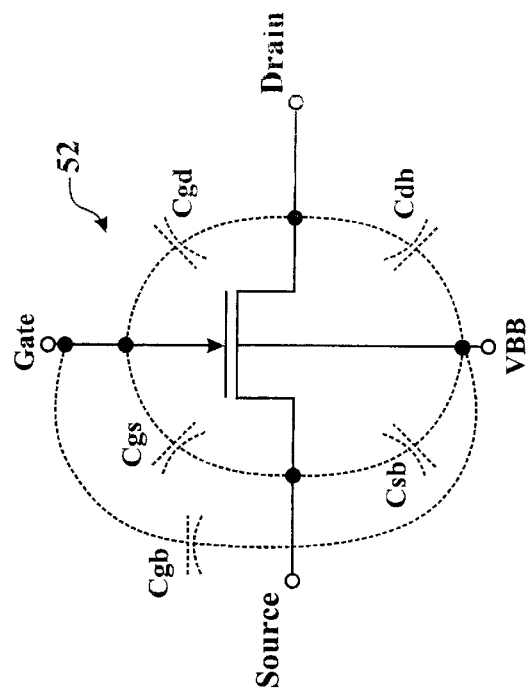
| $Cd = Cgd+Cdb$, $fF/\mu m^2$ | 1.4 |
| --- | --- |
| $Cg = Cgs+Cgd+Cgb$, $fF/\mu m^2$ | 7.8 |
| $Cs = Cgs+Csb$, $fF/\mu m^2$ | 5.0 |
| $Cb = Cgb+Csb+Cdb$, $fF/\mu m^2$ | 2.0 |
Fig. 2F  SOI CMOS Capacitance Model
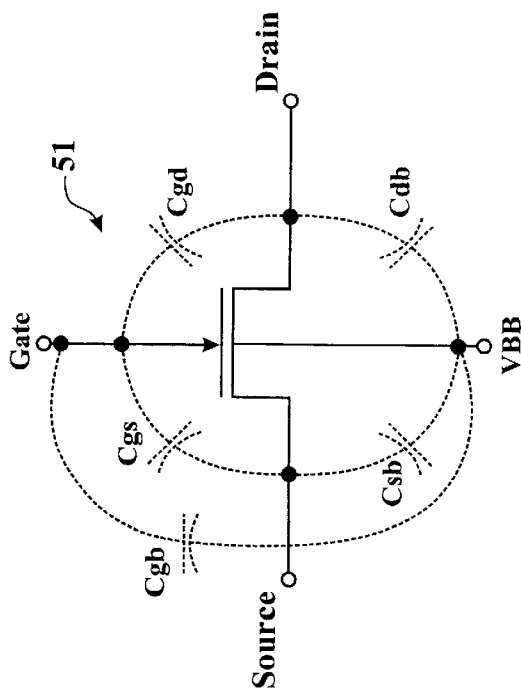
| $Cd = Cgd+Cdb$, $fF/\mu m^2$ | 0.6 |
| --- | --- |
| $Cg = Cgs+Cgd+Cgb$, $fF/\mu m^2$ | 2.4 |
| $Cs = Cgs+Csb$, $fF/\mu m^2$ | 1.6 |
| $Cb = Cgb+Csb+Cdb$, $fF/\mu m^2$ | 0.2 |

Remark: CLK = Logic Inversion of CLK, etc.

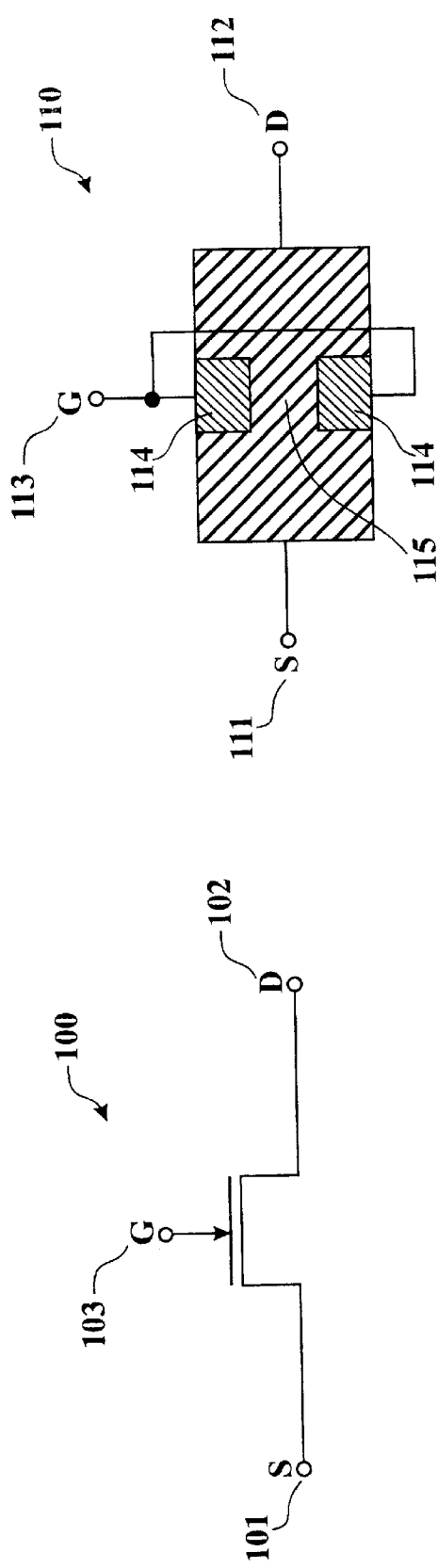
Fig. 7A  MOS FET
Fig. 7B  JUNCTION FET under US 6,556,056 B1

METHOD AND APPARATUS FOR USING PARASITIC EFFECTS IN PROCESSING HIGH SPEED SIGNALS

CROSS REFERENCE TO RELATED APPLICATIONS

This application is a continuation-in-part application of a prior U.S. application of Ser. No. 09/947,643, filed Sep. 5, 2001 by the same inventors, now U.S. Pat. No. 6,433,595.

BACKGROUND OF THE INVENTION

The present invention relates generally to the field of data communication. More particularity, the present invention concerns a generic design methodology of a new family of Field Effect Transistor (FET) Integrated Circuits (IC) made of a nonstandard industrial process. Thus, its direct applications include a variety of subsystem and system functions such as Master Slave D-type Flip Flop (MS-DFF), Divider, Bang Bang Phase Detector (BBPD), Frequency Detection (FD), Phase and Frequency Detection (PFD), Voltage Controlled Oscillator (VCO) and Phase Locked Loop (PLL) in an optical switch IC for data communication.

Optical Fiber has been used in voice and data communication for some time now due to its high bandwidth and excellent signal quality resulting from its immunity to electromagnetic interference. The inherent optical data rate from a modulated single-mode laser beam travelling through an optical fiber is expected to well exceed 1000 Gbit/sec. However, short of a completely optical communication system, the practically realizable bandwidth of fiber optical communication systems has been limited by the need of signal conversion between optical and electrical domain and the associated electronics hardware. While the usage of standard industrial CMOS (Complementary Metal Oxide Semiconductor) ICs, having a moderate speed capability, has already migrated into the electronics hardware for optical communication systems due to their advantage of low manufacturing cost, low operating power consumption, low supply voltage requirement and fairly good circuit density, FETs made of a nonstandard industrial process should still be employed for a variety of niche or as yet unforeseen future applications. For example, an IC made of a nonstandard CMOS process, called CMOS Silicon On Insulator (CMOS SOI), with an insulating substrate such as Sapphire, although quite expensive, processes the unique advantage of extremely low parasitic capacitance thus the potential of an operating speed even higher than that of a Bipolar IC made of a standard industrial process.

Notwithstanding the potential of these nonstandard FET ICs, to approach their fundamental speed capability in real circuits for such ultra high speed applications, a balanced systems design methodology must be developed.

SUMMARY OF THE INVENTION

The present invention is directed to a new family of FET ICs made with nonstandard industrial processes and a corresponding generic design methodology.

The first objective of this invention is to achieve a generic design methodology for a family of FET ICs made with nonstandard industrial processes with a reduced amount of signal ripple after the respective logic signal levels are reached following a switching operation.

Other objectives, together with the foregoing are attained in the exercise of the invention in the following description and resulting in the embodiment illustrated in the accompanying drawings.

BRIEF DESCRIPTION OF DRAWINGS

The current invention will be better understood and the nature of the objectives set forth above will become apparent when consideration is given to the following detailed description of the preferred embodiments. For clarity of explanation, the detailed description further makes reference to the attached drawings herein:

FIG. 2C and FIG. 2D respectively illustrates a standard CMOS transistor structure and a nonstandard CMOS transistor structure for the implementation of the Divide-by-16 divider of FIG. 2B.

FIG. 2E and FIG. 2F respectively illustrates the capacitance model of a standard CMOS transistor structure and a nonstandard CMOS transistor structure for the implementation of the Divide-by-16 divider of FIG. 2B.

FIG. 7A and FIG. 7B respectively illustrates a standard CMOS transistor structure and another nonstandard CMOS transistor structure for the implementation of the Divide-by-16 divider of FIG. 2B and the BBPD of FIG. 5B.

DETAILED DESCRIPTION OF THE PREFERRED EMBODIMENTS

In the following detailed description of the present invention, numerous specific details are set forth in order to provide a thorough understanding of the present invention. However, it will become obvious to those skilled in the art that the present invention may be practiced without these specific details. In other instances, well known methods, procedures, components, and circuitry have not been described in detail to avoid unnecessary obscuring aspects of the present invention. The detailed description is presented largely in terms of logic blocks and other symbolic representations that directly or indirectly resemble the operations of signal processing devices coupled to networks. These descriptions and representations are the means used by those experienced or skilled in the art to most effectively convey the substance of their work to others skilled in the art.

Reference herein to "one embodiment" or an "embodiment" means that a particular feature, structure, or characteristics described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations of the invention.

Figure 1:
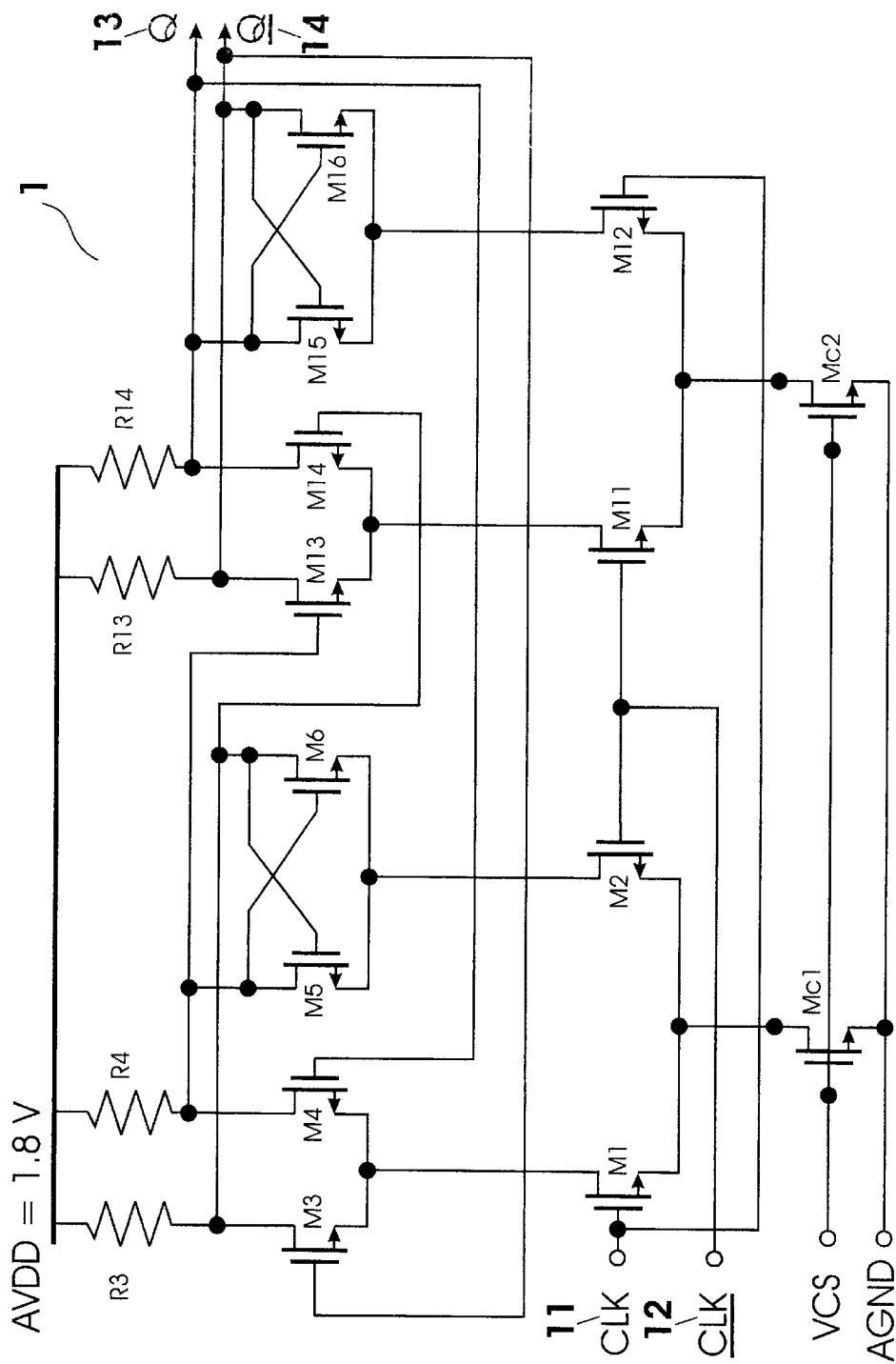
FIG. 1 shows a typical circuit architecture of a Divide-by-2 divider with current mode switching.
Figure 2A:
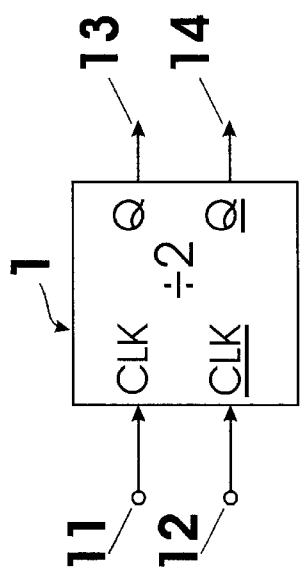
FIG. 2A shows a logic functional block representation of the Divide-by-2 divider shown in FIG. 1.

FIG. 1 shows a typical circuit architecture of a Divide-by-2 DIVIDER 1 with current mode switching. In this exemplary illustration the supply voltage AVDD is shown to be 1.8 Volt although other values could be used just as well, for example 2.5 Volt. AGND designates "analog ground" and VCS is a bias voltage applied to the gates of transistors Mc1 and Mc2 to set up a corresponding amount of source current flowing through them. Through DIVIDER 1, the frequency of a differential signal between CLK 11 and CLK 12 will be divided in half as the differential signal between Q 13 and Q 14. The various active NMOS transistors are designated as Mc1, Mc2, M1, M2, . . . , and M16. The four pull-up resistors are designated R3, R4, R13 and R14. For those skilled in the art, this type of circuitry is manufacturable with a standard CMOS IC as well as a variety of nonstandard CMOS IC processes. In addition, if DIVIDER 1 could be quantitatively designed to provide a high quality signal output at a high CLK frequency, such as 2.5 GHz for OC-48 communication, then DIVIDER 1 can be used as one of the fundamental building blocks of a low cost optical switch for an optical network. For convenience, the associated logic functional block representation is shown in FIG. 2A.

Figure 2B:
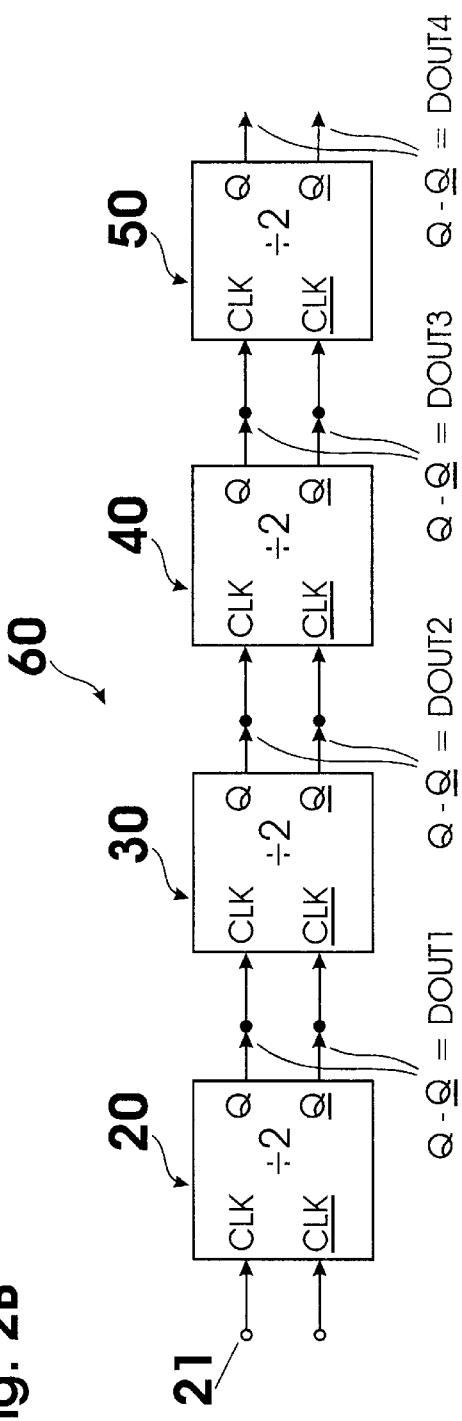
FIG. 2B is a logic functional block diagram of a typical Divide-by-16 divider using the Divide-by-2 divider from FIG. 1.

FIG. 2B is a logic functional block diagram of a typical Divide-by-16 DIVIDER 60 using the Divide-by-2 divider from FIG. 1 as its logic building block. Specifically, the replicated logic building blocks are labeled as DIVIDER 20, DIVIDER 30, DIVIDER 40 and DIVIDER 50. For those skilled in the art, it can be easily seen that the frequency of INPUT CLOCK 21 gets divided by two (2) as differential signal Q−Q=DOUT1 at the output of DIVIDER 20. Likewise, the frequency of INPUT CLOCK 21 gets divided by four (4) as differential signal Q−Q=DOUT2 at the output of DIVIDER 30. The frequency of INPUT CLOCK 21 gets divided by eight (8) as differential signal Q−Q=DOUT3 at the output of DIVIDER 40. Finally, the frequency of INPUT CLOCK 21 gets divided by sixteen (16) as differential signal Q−Q=DOUT4 at the output of DIVIDER 50.

FIG. 2C and FIG. 2D respectively illustrates the cross sections, with some typical dimensions shown, of a standard CMOS transistor structure and a nonstandard CMOS transistor structure that will be used for the implementation of the Divide-by-16 divider of FIG. 2B. The standard CMOS structural substrate of FIG. 2C comprises an N substrate 31 and a P-well 32. The N substrate 31 is biased at a voltage VBB. Within the N substrate 31 are built-in P source and drain 35. Within the P-well 32 are built-in N+source and drain 34. On top of the P-well 32 are formed a number of Silicon Dioxide 37 which in turn are selectively deposited with another number of metal 39. Additionally, a selected number of the Silicon Dioxide 37 are embedded with a corresponding number of Polysilicon gate 38 forming the gates of their respective NMOS and PMOS transistors. The complete standard CMOS circuit is driven by a gate voltage Gate and powered with voltages VSS and GND.

The nonstandard CMOS transistor structure of FIG. 2D, to be used for the implementation of the Divide-by-16 divider of FIG. 2B, is called a Silicon On Insulator (SOI) structure having an insulating sapphire substrate 41 of thickness 27 mm, or 27000 $\mu$m. The insulating sapphire substrate. 41 is biased at a voltage VBB. Similar to the standard CMOS transistor structure, the various CMOS circuit components are formed with a number of N+ source and drain 44, a number P source and drain 45, a number of Silicon Dioxide 47 with selectively embedded Polysilicon gate 48 and deposited metal 49. Likewise, the complete nonstandard CMOS circuit is driven by a gate voltage Gate and powered with voltages VSS and GND.

FIG. 2E and FIG. 2F respectively illustrates the capacitance model of a standard CMOS transistor structure and a nonstandard CMOS transistor structure for the implementation of the Divide-by-16 divider of FIG. 2B. The standard CMOS capacitance model 51 of FIG. 2E comprises various capacitive components for each externally accessible node. For example, for the node Gate the corresponding capacitive components are:

Cgs, Cgd and Cgb.

For another example, for the node VBB, a substrate connection, the corresponding capacitive components are:

Cgb, Csb and Cdb, etc.

Qualitatively, the SOI CMOS capacitance model 52 of FIG. 2F is, as shown, really the same as the standard CMOS capacitance model 51. However, quantitatively the capacitance values are seen to be quite different between the standard CMOS structure and the SO CMOS structure. For convenience, the following tables relist the approximate value of various capacitive components relevant to the operational speed of both the standard CMOS and the SOI CMOS transistor structure:

Standard CMOS Transistor Structure Capacitances
   Cd=1.4 fF/$\mu$m$^2$ ($10^{-15}$ Farad/$\mu$m$^2$)
   Cg=7.8 fF/$\mu$m$^2$ ($10^{-15}$ Farad/$\mu$m$^2$)
   Cs=5.0 fF/$\mu$m$^2$ ($10^{-15}$ Farad/$\mu$m$^2$)
   Cb=2.0 fF/$\mu$m$^2$ ($10^{-15}$ Farad/$\mu$m$^2$)

SOI CMOS TRANSISTOR STRUCTURE CAPACITANCES
   Cd=0.6 fF/$\mu$m$^2$
   Cg=2.4 fF/$\mu$m$^2$
   Cs=1.6 fF/$\mu$m$^2$
   Cb=0.2 fF/$\mu$m$^2$

Notice that, for the case of the standard CMOS structure of FIG. 2C, the various N+ source and drain 34 within the P-well 32 are only separated from the conductive N substrate 31 by a distance less than 1–2 $\mu$m in thickness. Additionally, the various P source and drain 35 are in direct contact, although through a correspondingly formed reverse-biased diode structure, with the conductive N substrate 31. Therefore, the value of capacitance Cb under the standard CMOS structure is significant. However, for the case of the SOI CMOS structure of FIG. 2D, the various N+ source and drain 44 and P source and drain 45 are in direct contact with the insulating sapphire substrate 41 that is huge in thickness (27000 $\mu$m). Therefore, the value of capacitance Cb under the SOI CMOS structure has become drastically smaller than the case of standard CMOS transistor structure.

Additionally, the other capacitances Cd, Cg and Cs have all become significantly smaller than their values under the standard CMOS structure. Therefore, under an otherwise identical circuit topology, the associated quantitative signal waveforms from an SOI CMOS structure will in general be drastically different from those generated with a standard CMOS structure. Thus, the just described circuit architecture will be quantitatively adjusted for the SOI CMOS structure to realize a new circuit design capable of producing higher levels of output signal quality especially suitable for high CLK frequency for optical communications and this will be presently illustrated.

It is well known in the art that, at the IC-design level for a given wafer process, the conductance of an MOS transistor is primarily determined by the following parameter:

W/L, where W=channel width and L=channel length.
For convenience, the following parameter is defined:

Electrically Equivalent Channel Geometry (EECG)=W/L.

Given the above definition, TABLE 1A shows a tabulated design comparison between a typical practice and the current invention of a first building block of Divide-by-2 DIVIDER 20 for the Divide-by-16 DIVIDER 60 as shown in FIG. 2B. For example, with typical practice, transistors Mc1 and Mc2 both have an EECG of 60 while transistors M1, M2, M11 and M12 all have an EECG of 120, etc. Likewise, with the current invention, transistors Mc1 and Mc2 both have an EECG of 60 while transistors M1, M2, M11 and M12 all have an EECG of 180, etc.

TABLE 1A

Design of EECG for DIVIDER 20

| | TYPICAL PRACTICE | | CURRENT INVENTION | |
|---|---|---|---|---|
| | EECG | RATIO of EECG | EECG | RATIO of EECG |
| Mc1 | 60 | 1 | Mc1 | 60 | 1.00 |
| Mc2 | 60 | 1 | Mc2 | 60 | 1.00 |
| M1 | 120 | 2 | M1 | 180 | 3.00 |
| M2 | 120 | 2 | M2 | 180 | 3.00 |
| M11 | 120 | 2 | M11 | 180 | 3.00 |
| M12 | 120 | 2 | M12 | 180 | 3.00 |
| M3 | 120 | 2 | M3 | 200 | 3.33 |
| M4 | 120 | 2 | M4 | 200 | 3.33 |
| M5 | 120 | 2 | M5 | 240 | 4.00 |
| M6 | 120 | 2 | M6 | 240 | 4.00 |
| M13 | 120 | 2 | M13 | 200 | 3.33 |
| M14 | 120 | 2 | M14 | 200 | 3.33 |
| M15 | 120 | 2 | M15 | 240 | 4.00 |
| M16 | 120 | 2 | M16 | 240 | 4.00 |

For the purpose of explanation, a separate column called "RATIO of EECG" is further defined to be the simplest possible ratio of EECG amongst the complete set of transistors for each case of design. Thus, the RATIO OF EECG for each case of design forms a separate data column. For example, under current invention of TABLE 1A the following is seen:

RATIO of EECG of M3:M5:M13=3.33:4.00:3.33, etc.

In this way, the salient characteristics of a quantitative design can be more easily revealed and this is illustrated respectively in TABLE 1B, TABLE 1C and TABLE 1D where a tabulated design comparison between a typical practice and the current invention of a second, a third and a fourth building block of the Divide-by-16 DIVIDER 60 is respectively shown.

TABLE 1B

Design of EECG for DIVIDER 30

| | TYPICAL PRACTICE | | CURRENT INVENTION | |
|---|---|---|---|---|
| | EECG | RATIO of EECG | EECG | RATIO of EECG |
| Mc1 | 50 | 1 | Mc1 | 50 | 1.00 |
| Mc2 | 50 | 1 | Mc2 | 50 | 1.00 |
| M1 | 100 | 2 | M1 | 120 | 2.40 |
| M2 | 100 | 2 | M2 | 120 | 2.40 |
| M11 | 100 | 2 | M11 | 120 | 2.40 |
| M12 | 100 | 2 | M12 | 120 | 2.40 |
| M3 | 100 | 2 | M3 | 120 | 2.40 |
| M4 | 100 | 2 | M4 | 120 | 2.40 |
| M5 | 100 | 2 | M5 | 480 | 9.60 |
| M6 | 100 | 2 | M6 | 480 | 9.60 |
| M13 | 100 | 2 | M13 | 120 | 2.40 |
| M14 | 100 | 2 | M14 | 120 | 2.40 |
| M15 | 100 | 2 | M15 | 480 | 9.60 |
| M16 | 100 | 2 | M16 | 480 | 9.60 |

TABLE 1C

Design of EECG for DIVIDER 40

| | TYPICAL PRACTICE | | CURRENT INVENTION | |
|---|---|---|---|---|
| | EECG | RATIO of EECG | EECG | RATIO of EECG |
| Mc1 | 40 | 1 | Mc1 | 40 | 1.00 |
| Mc2 | 40 | 1 | Mc2 | 40 | 1.00 |
| M1 | 80 | 2 | M1 | 100 | 2.50 |
| M2 | 80 | 2 | M2 | 100 | 2.50 |
| M11 | 80 | 2 | M11 | 100 | 2.50 |
| M12 | 80 | 2 | M12 | 100 | 2.50 |
| M3 | 80 | 2 | M3 | 100 | 2.50 |
| M4 | 80 | 2 | M4 | 100 | 2.50 |
| MS | 80 | 2 | M5 | 900 | 22.50 |
| M6 | 80 | 2 | M6 | 900 | 22.50 |
| M13 | 80 | 2 | M13 | 100 | 2.50 |
| M14 | 80 | 2 | M14 | 100 | 2.50 |
| M15 | 80 | 2 | M15 | 900 | 22.50 |
| M16 | 80 | 2 | M16 | 900 | 22.50 |

TABLE 1D

Design of EECG for DIVIDER 50

| | TYPICAL PRACTICE | | CURRENT INVENTION | |
|---|---|---|---|---|
| | EECG | RATIO of EECG | EECG | RATIO of EECG |
| Mc1 | 30 | 1 | Mc1 | 30 | 1.00 |
| Mc2 | 30 | 1 | Mc2 | 30 | 1.00 |
| M1 | 60 | 2 | M1 | 80 | 2.67 |
| M2 | 60 | 2 | M2 | 80 | 2.67 |
| M11 | 60 | 2 | M11 | 80 | 2.67 |
| M12 | 60 | 2 | M12 | 80 | 2.67 |
| M3 | 60 | 2 | M3 | 80 | 2.67 |
| M4 | 60 | 2 | M4 | 80 | 2.67 |
| M5 | 60 | 2 | M5 | 1400 | 46.67 |
| M6 | 60 | 2 | M6 | 1400 | 46.67 |
| M13 | 60 | 2 | M13 | 80 | 2.67 |
| M14 | 60 | 2 | M14 | 80 | 2.67 |
| M15 | 60 | 2 | M15 | 1400 | 46.67 |
| M16 | 60 | 2 | M16 | 1400 | 46.67 |

Referring now to TABLEs 2–5, there are further illustrated the difference in quantitative designs of the building blocks between the typical practice and the current invention with respect to the EECG and the ratio of EECG of selected transistors. For example, the EECG and ratio of EECG of transistor M1 under typical practice would form the following TABLE-2:

TABLE 2

EECG of transistor M1 - typical practice

|  | DIVIDER 20 | DIVIDER 30 | DIVDER 40 | DIVIDER 50 |
|---|---|---|---|---|
| EECG | 120 | 100 | 80 | 60 |
| Ratio of EECG | 2 | 2 | 2 | 2 |

However, the corresponding EECG and ratio of EECG of transistor M1 under the current invention would form the following TABLE-3:

TABLE 3

EECG of transistor M1 - current invention

|  | DIVIDER 20 | DIVIDER 30 | DIVIDER 40 | DIVIDER 50 |
|---|---|---|---|---|
| EECG | 180 | 120 | 100 | 80 |
| Ratio of EECG | 3 | 2.4 | 2.5 | 2.67 |

For another example, the EECG and ratio of EECG of transistor M13 under typical practice would form the following TABLE-4:

TABLE 4

EECG of transistor M13 - typical practice

|  | DIVIDER 20 | DIVIDER 30 | DIVIDER 40 | DIVIDER 50 |
|---|---|---|---|---|
| EECG | 120 | 100 | 80 | 60 |
| Ratio of EECG | 2 | 2 | 2 | 2 |

However, the corresponding EECG and ratio of EECG of transistor M13 under the current invention would form the following TABLE-5:

TABLE 5

EECG of transistor M13 - current invention

|  | DIVIDER 20 | DIVIDER 30 | DIVIDER 40 | DIVIDER 50 |
|---|---|---|---|---|
| EECG | 200 | 120 | 100 | 80 |
| Ratio of EECG | 3.33 | 2.4 | 2.5 | 2.67 |

As revealed by TABLE-2, while there is a general trend of decreasing EECG of transistor M1 going from DIVIDER 20 to DIVIDER 50, the respective ratios of EECG, however, remain unchanged throughout DIVIDER 20 to DIVIDER 50, as a single designed value of 2 for transistor M1. Likewise, TABLE-4 reveals that, while there is also a general trend of decreasing EECG of transistor M13 going from DIVIDER 20 to DIVIDER 50, the ratios of EECG remain unchanged throughout DIVIDER 20 to DIVIDER 50 as a single designed value of 2 for transistor M13. In fact, a systematic comparison of the EECGs and the ratios of EECG of the rest of the transistors of the typical practice reveals the same observation. It is therefore apparent that, with typical practice, the quantitative design of all the individual building blocks of DIVIDER 60 is essentially similar. It is understood by those skilled in the art that the general trend of decreasing EECG of all transistors going from DIVIDER 20 to DIVIDER 50 is because, as the CLK frequency gets divided down further and further, the lowered speed of circuit operation would only need correspondingly lowered level of operating current with reduced value of EECG to reduce power consumption.

However, referring to the building blocks of the current invention as shown in TABLE-3, which reveals that, while there is a similar general trend of decreasing EECG of transistor M1 going from DIVIDER 20 to DIVIDER 50, none of the respective ratios of EECG shares a single designed value common to all the individual building blocks of DIVIDER 60 throughout DIVIDER 20 to DIVIDER 50. Likewise, TABLE-5 reveals that, while there is a general trend of decreasing EECG of transistor M13 going from DIVIDER 20 to DIVIDER 50, none of the respective ratios of EECG of transistor M13 shares a single designed value common to all the individual building blocks of DIVIDER 60 throughout DIVIDER 20 to DIVIDER 50. In fact, a systematic comparison of the EECGs and the ratios of EECG of the rest of the transistors with the current invention reveals the same observation. Therefore, with the current invention, the quantitative designs of each of the individual building blocks of DIVIDER 60 are different from the others. For those skilled in the art, the current invention discloses a unique design feature distinctly different from that known to the typical practice in view of the fact that the current invention requires all the individual building blocks of DIVIDER 60 being designed differently to achieve a much higher level of output signal quality which is otherwise unachievable by the art taught by the typical practice.

TABLE 1E is a tabulated overall design comparison, in terms of the ratio of EECG, between a typical practice and the current invention of the Divide-by-16 DIVIDER 60 as shown in FIG. 2B. It is clearly seen that, while the qualitative design of all the individual building blocks of DIVIDER 60 according to the typical practice is rather similar, the quantitative design of each building block of DIVIDER 60 according to the current invention is different because each of the building blocks needs to be individually adjusted to achieve a much higher level of output signal quality in the presence of such undesirable deteriorating effects like output loading and

TABLE 1E

Overview of Design of EECG for DIVIDER 60

| | TYPICAL PRACTICE | | | | | CURRENT INVENTION | | | |
|---|---|---|---|---|---|---|---|---|---|
| | RATIO of EECG DIV1 | RATIO of EECG DIV2 | RATIO of EECG DIV3 | RATIO of EECG DIV4 | | RATIO of EECG DIV1 | RATIO of EECG DIV2 | RATIO of EECG DIV3 | RATIO of EECG DIV4 |
| Mc1 | 1 | 1 | 1 | 1 | Mc1 | 1.00 | 1.00 | 1.00 | 1.00 |
| Mc2 | 1 | 1 | 1 | 1 | Mc2 | 1.00 | 1.00 | 1.00 | 1.00 |

TABLE 1E-continued

Overview of Design of EECG for DIVIDER 60

Figures 1, 3A:
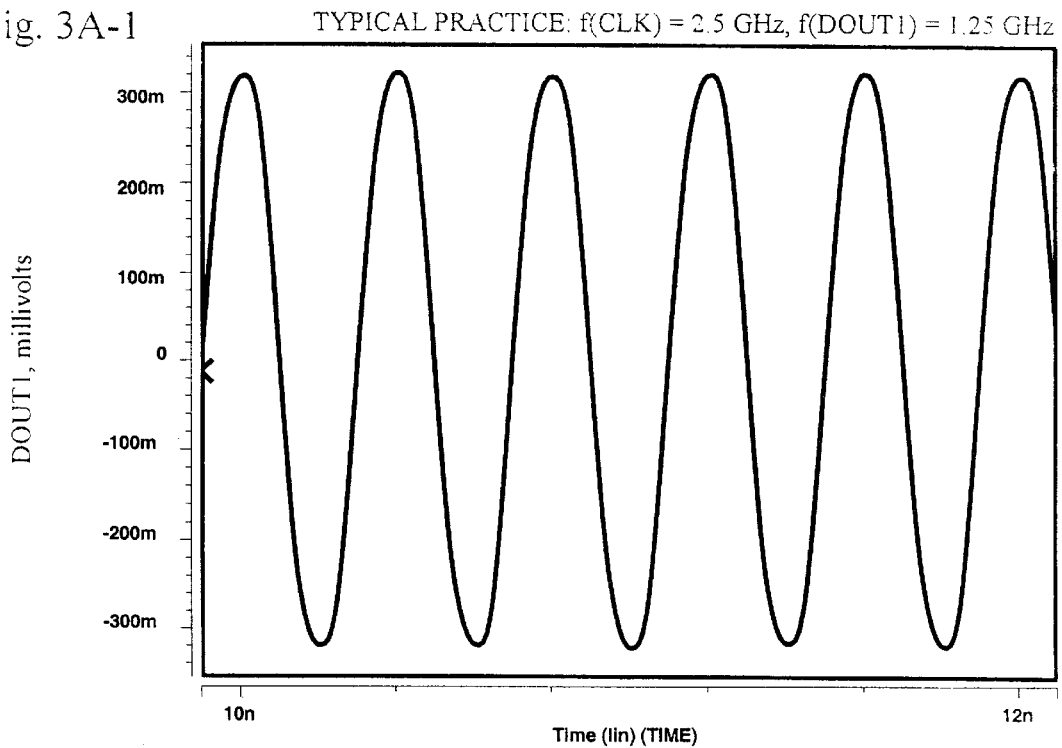
FIG. 3A compares the output signal ripple between a typical practice and the current invention of a first building block of Divide-by-2 divider for the Divide-by-16 divider in FIG. 2B.
Figures 2, 3A:
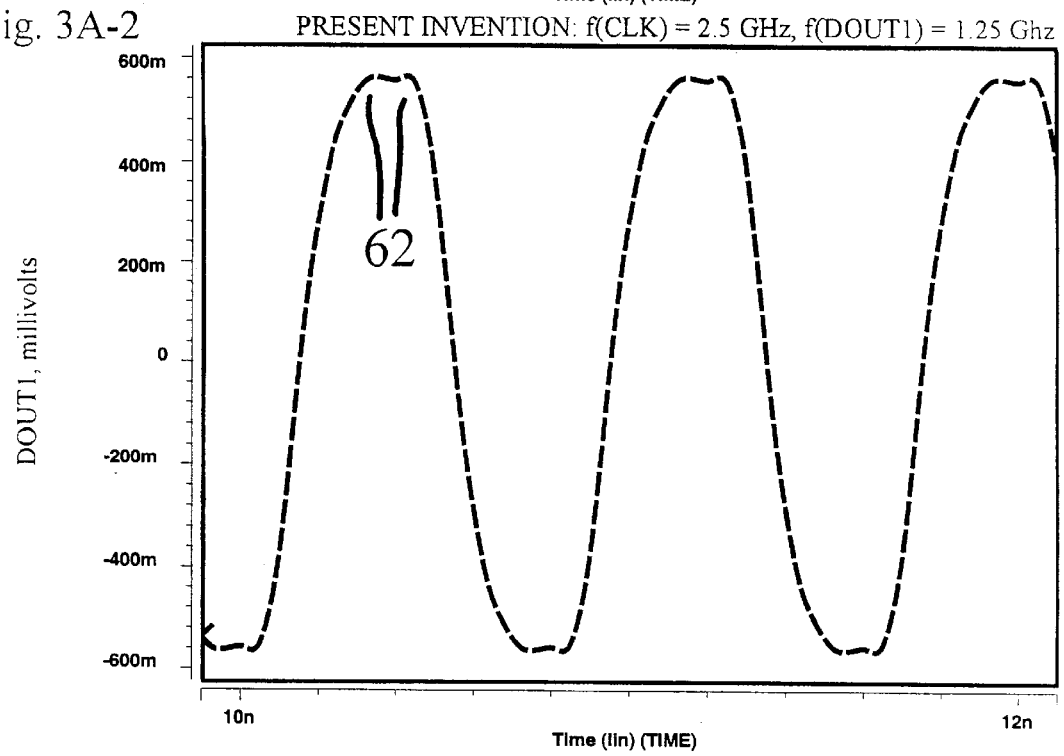

| | TYPICAL PRACTICE | | | | | CURRENT INVENTION | | | |
|---|---|---|---|---|---|---|---|---|---|
| | RATIO of EECG DIV1 | RATIO of EECG DIV2 | RATIO of EECG DIV3 | RATIO of EECG DIV4 | | RATIO of EECG DIV1 | RATIO of EECG DIV2 | RATIO of EECG DIV3 | RATIO of EECG DIV4 |
| M1  | 2 | 2 | 2 | 2 | M1  | 3.00 | 2.40 | 2.50  | 2.67  |
| M2  | 2 | 2 | 2 | 2 | M2  | 3.00 | 2.40 | 2.50  | 2.67  |
| M11 | 2 | 2 | 2 | 2 | M11 | 3.00 | 2.40 | 2.50  | 2.67  |
| M12 | 2 | 2 | 2 | 2 | M12 | 3.00 | 2.40 | 2.50  | 2.67  |
| M3  | 2 | 2 | 2 | 2 | M3  | 3.33 | 2.40 | 2.50  | 2.67  |
| M4  | 2 | 2 | 2 | 2 | M4  | 3.33 | 2.40 | 2.50  | 2.67  |
| M5  | 2 | 2 | 2 | 2 | M5  | 4.00 | 9.60 | 22.50 | 46.67 |
| M6  | 2 | 2 | 2 | 2 | M6  | 4.00 | 9.60 | 22.50 | 46.67 |
| M13 | 2 | 2 | 2 | 2 | M13 | 3.33 | 2.40 | 2.50  | 2.67  |
| M14 | 2 | 2 | 2 | 2 | M14 | 3.33 | 2.40 | 2.50  | 2.67  |
| M15 | 2 | 2 | 2 | 2 | M15 | 4.00 | 9.60 | 22.50 | 46.67 |
| M16 | 2 | 2 | 2 | 2 | M16 | 4.00 | 9.60 | 22.50 | 46.67 | interaction between adjacent building blocks. Typically, these effects become especially pronounced at high CLK frequencies such as those for high speed optical communications presented here. Thus, FIG. 3A compares the output signal ripple, DOUT1, between a typical practice and the current invention of the first building block of Divide-by-2 DIVIDER 20 for the Divide-by-16 DIVIDER 60 driven with an INPUT CLOCK 21 of frequency f(CLK)=2.50 GHz. Notice that, with typical practice, the output signal has COMPLETELY failed its divider function with a totally wrong frequency while the current invention signal ripple 62 is just visible. This is obviously a drastic improvement.

Figures 1, 3B:
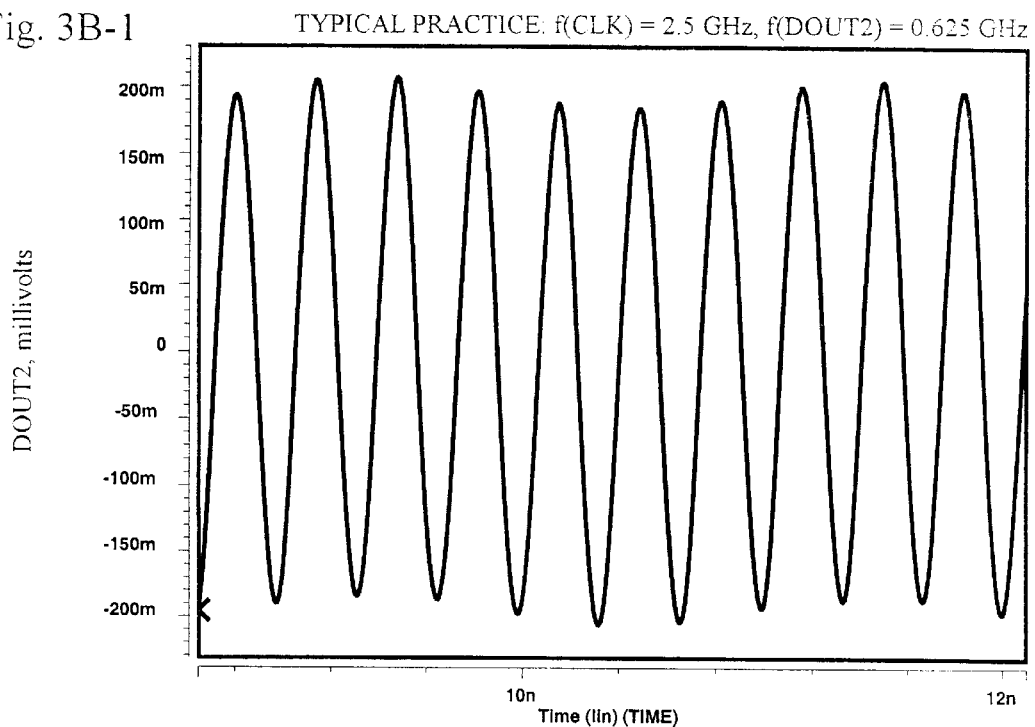
FIG. 3B compares the output signal ripple between a typical practice and the current invention of a second building block of Divide-by-2 divider for the Divide-by-16 divider in FIG. 2B.
Figures 2, 3B:
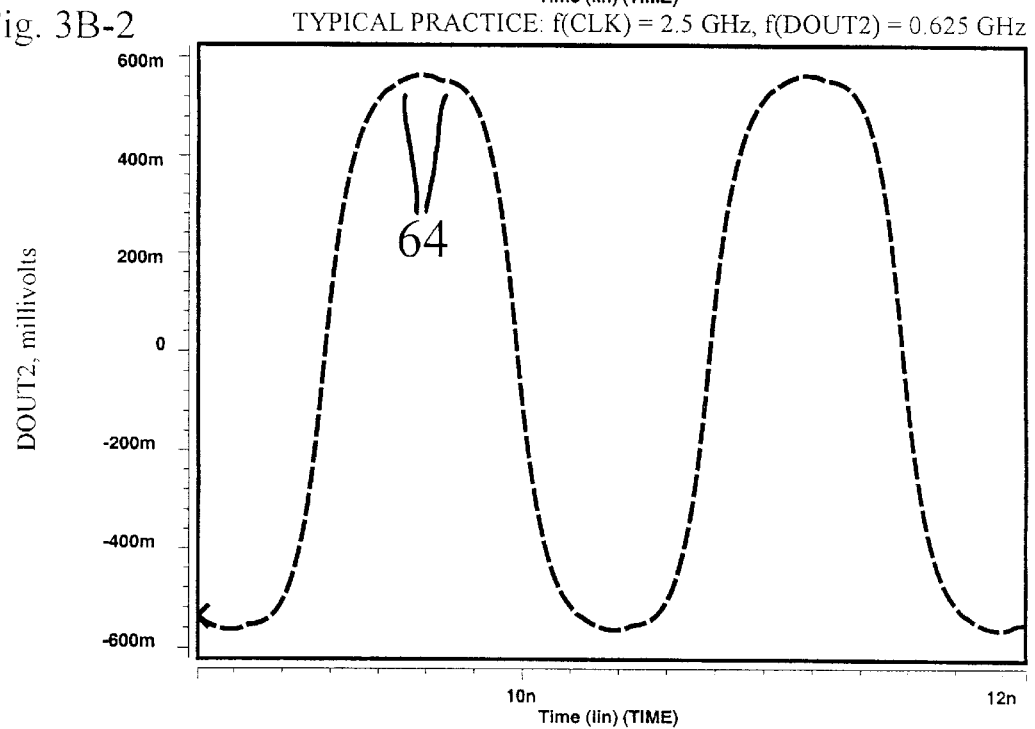
Figures 1, 3C:
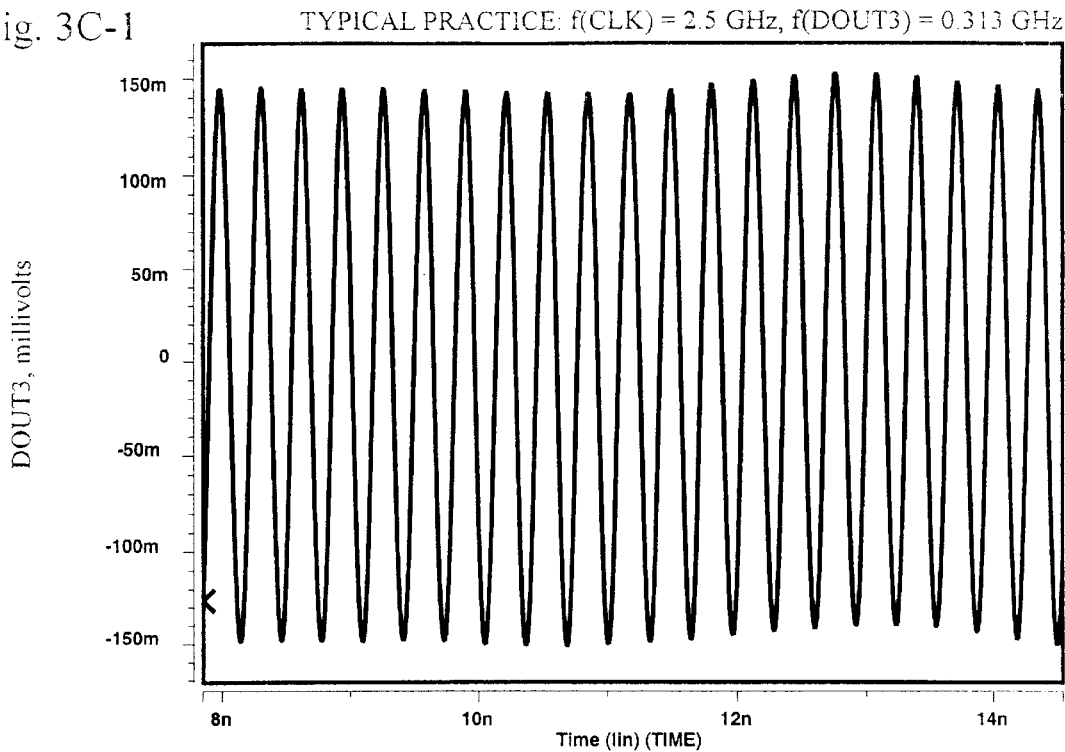
FIG. 3C compares the output signal ripple between a typical practice and the current invention of a third building block of Divide-by-2 divider for the Divide-by-16 divider in FIG. 2B.
Figures 2, 3C:
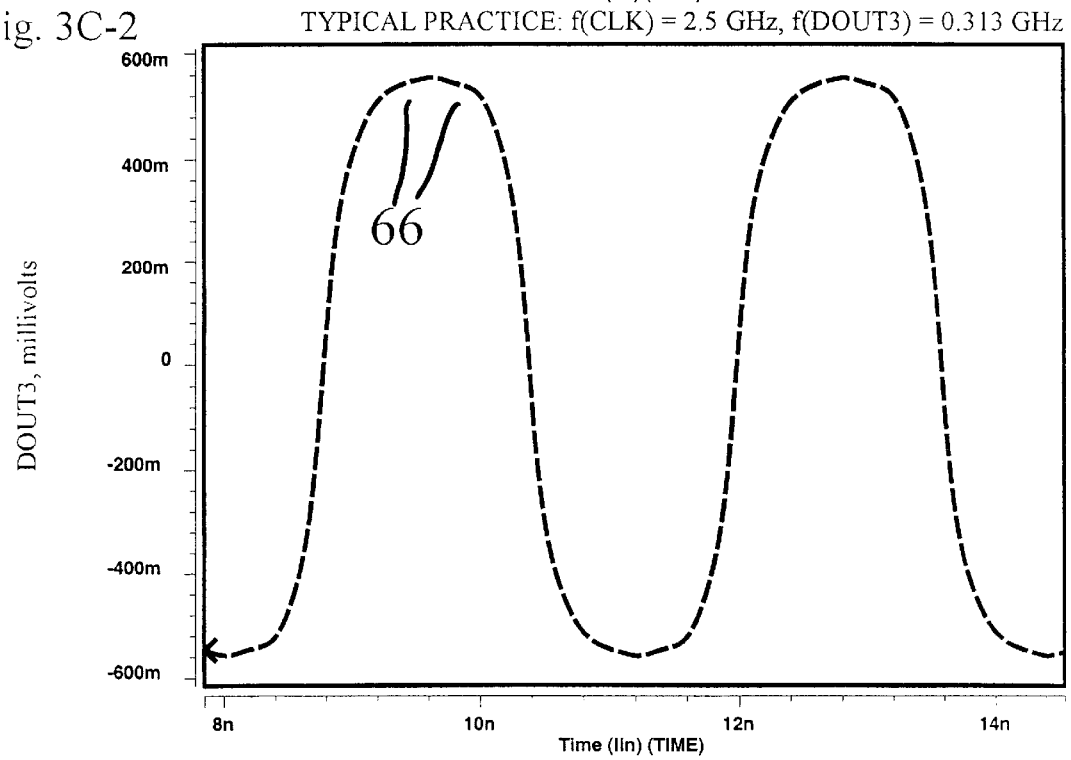
Figures 1, 3D:
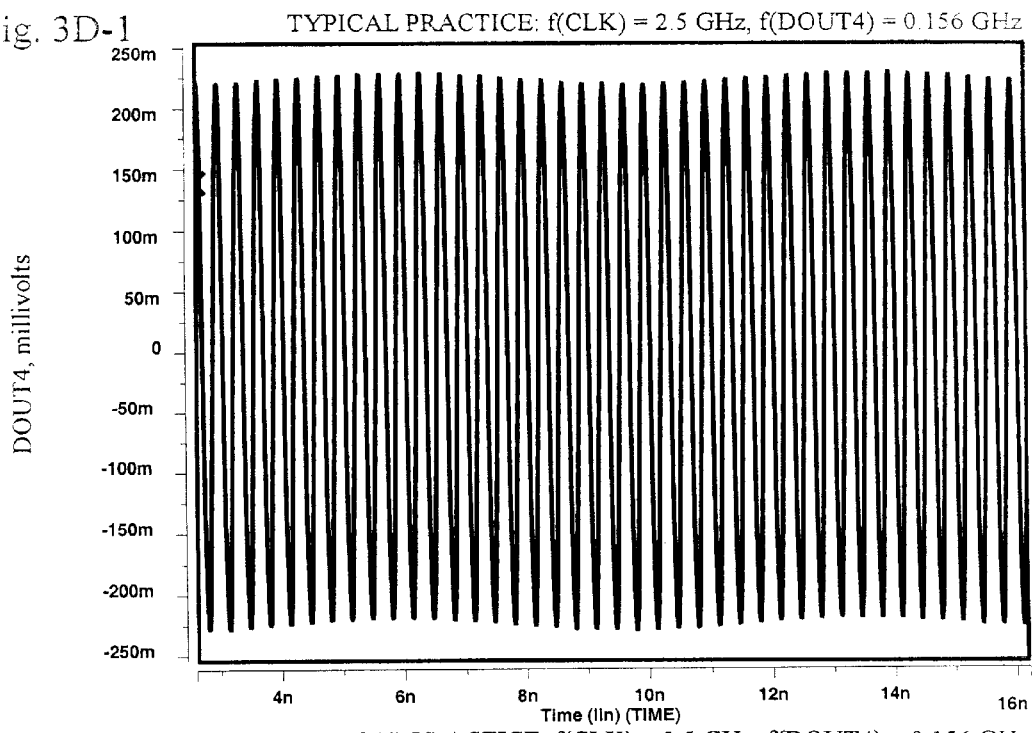
FIG. 3D compares the output signal ripple between a typical practice and the current invention of a fourth building block of Divide-by-2 divider for the Divide-by-16 divider in FIG. 2B.
Figures 2, 3D:
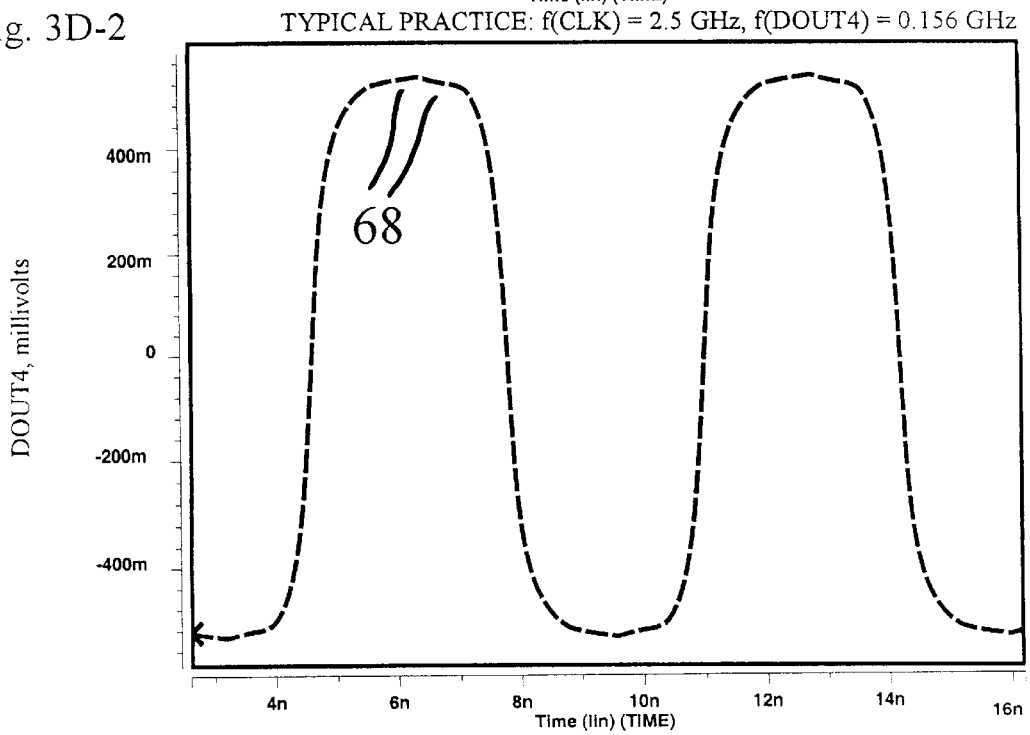

Similarly, FIG. 3B, FIG. 3C and FIG. 3D respectively compares the output signal ripple, DOUT2, DOUT3 and DOUT4, between a typical practice and the current invention of the building blocks of DIVIDER 30, DIVIDER 40 and DIVIDER 50 for the Divide-by-16 DIVIDER 60 driven with an INPUT CLOCK 21 of the same frequency f(CLK)= 2.50 GHz. Again, the same drastic improvement between a total failure of the typical practice and just visible signal ripple 64, 66 and 68 of the current invention are observed.

Figure 4:
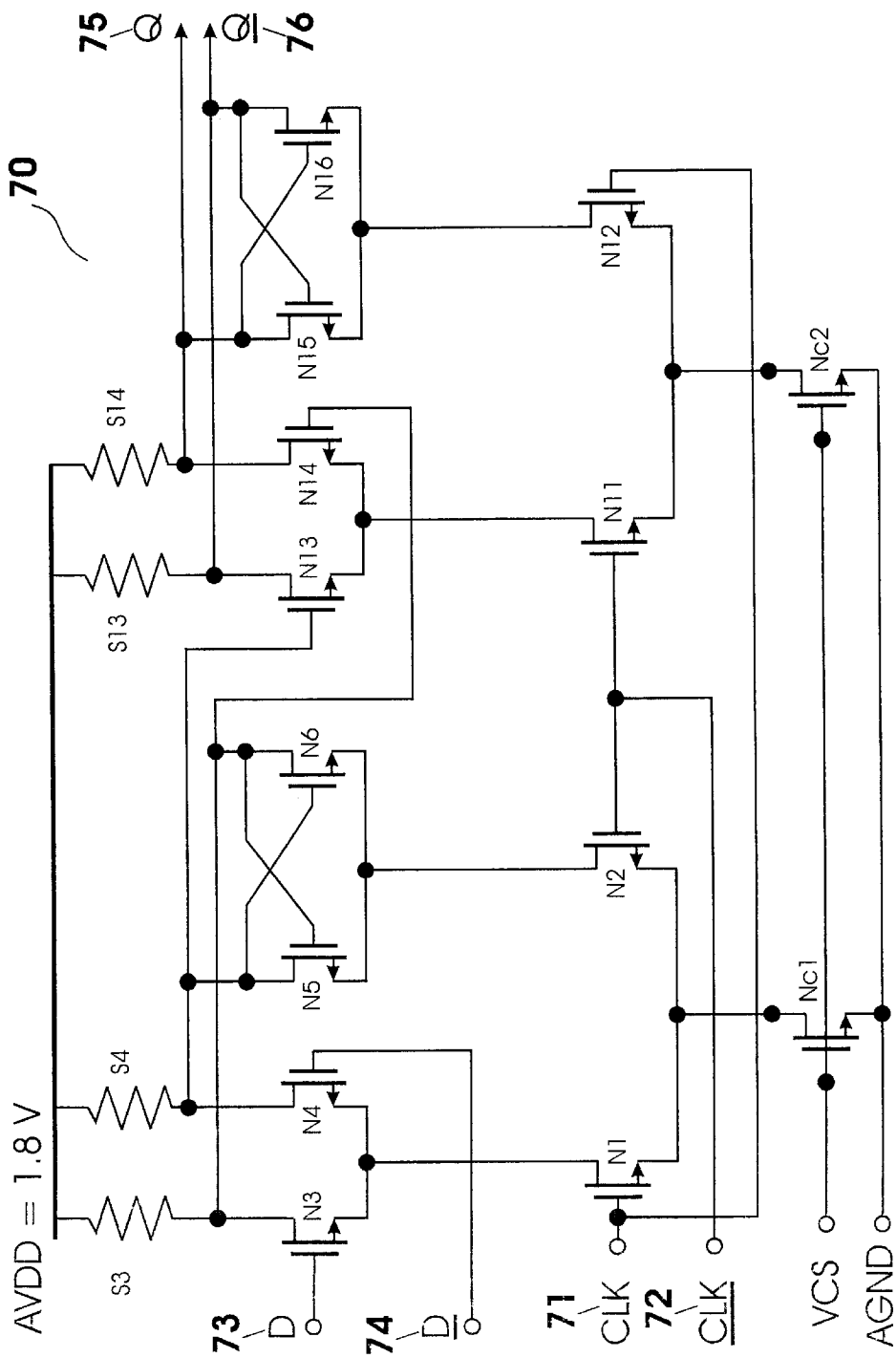
FIG. 4 shows a typical circuit architecture of an MS-DFF with current mode switching.
Figure 5A:
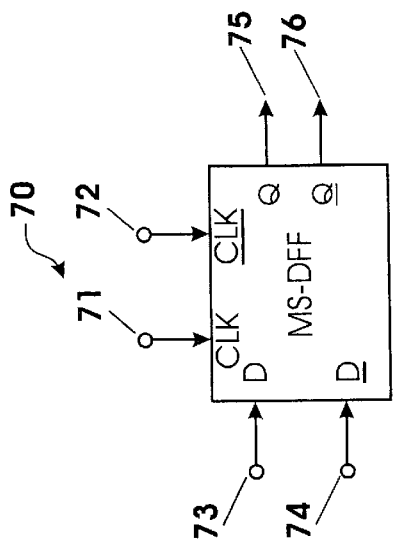
FIG. 5A shows a logic functional block representation of the MS-DFF as shown in FIG. 4.
Figure 5B:
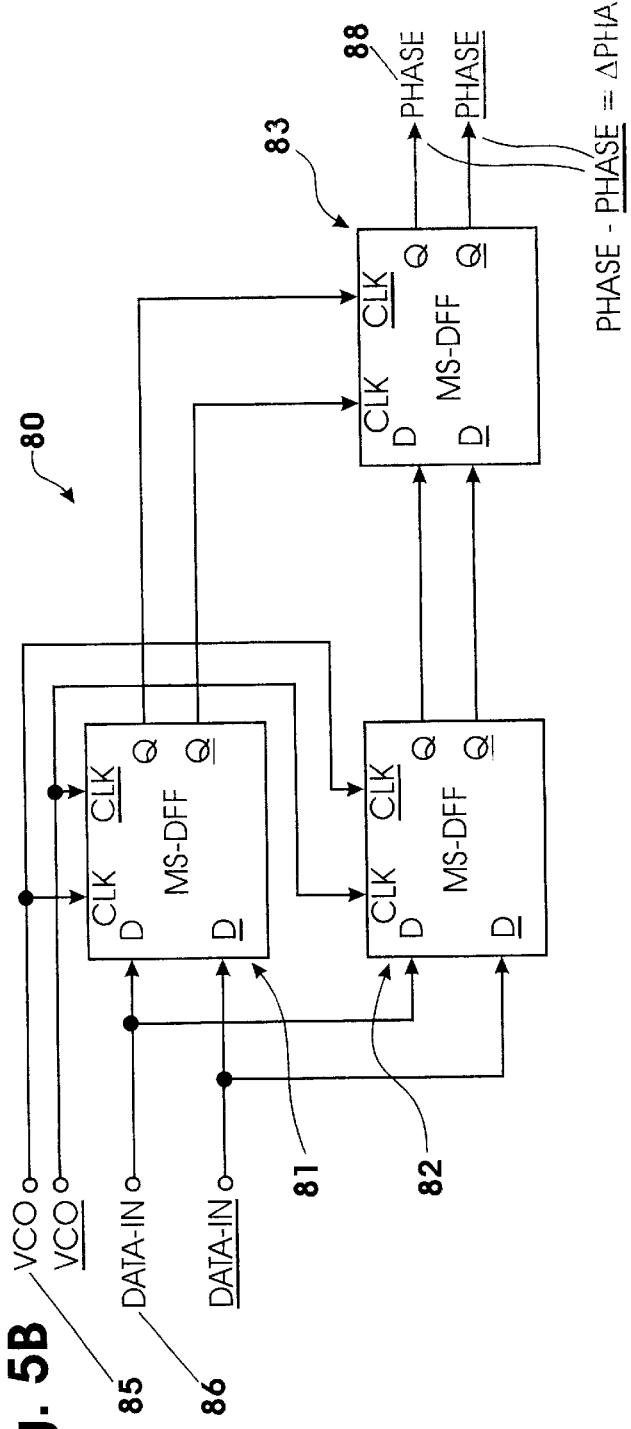
FIG. 5B is a logic functional block diagram of a typical BBPD using the MS-DFF from FIG. 4 as its logic building block.
Figure 6A:
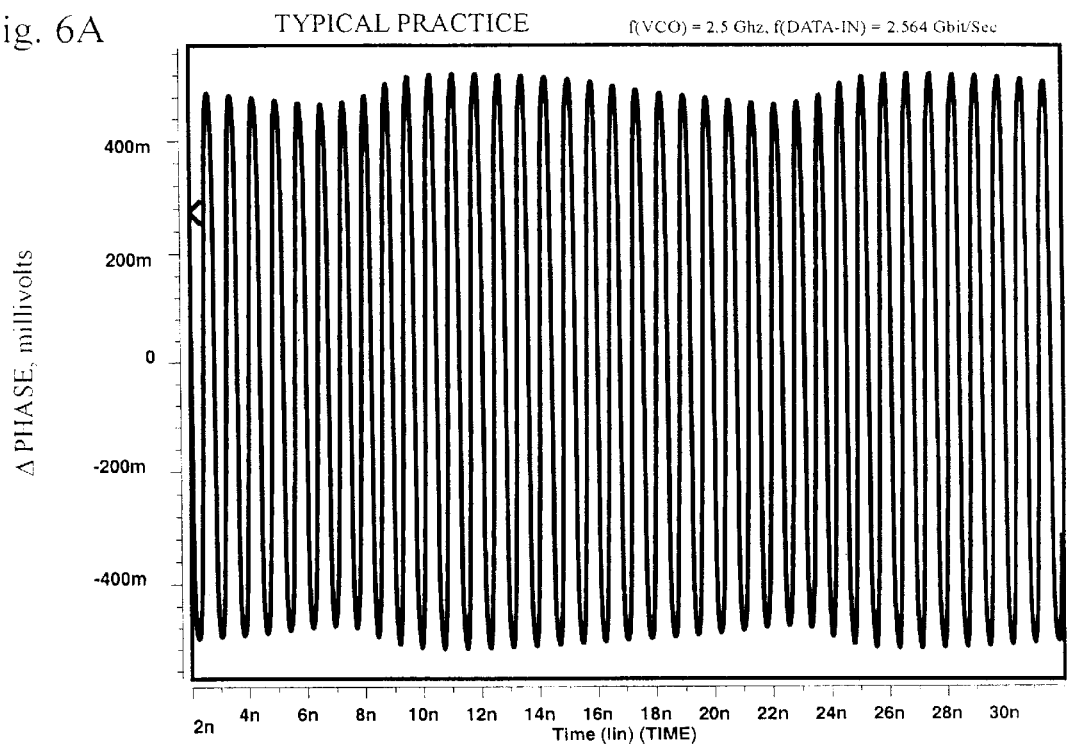
FIG. 6A and FIG. 6B compare the output signal ripple between a typical practice and the current invention of the BBPD in FIG. 5B.
Figure 6B:
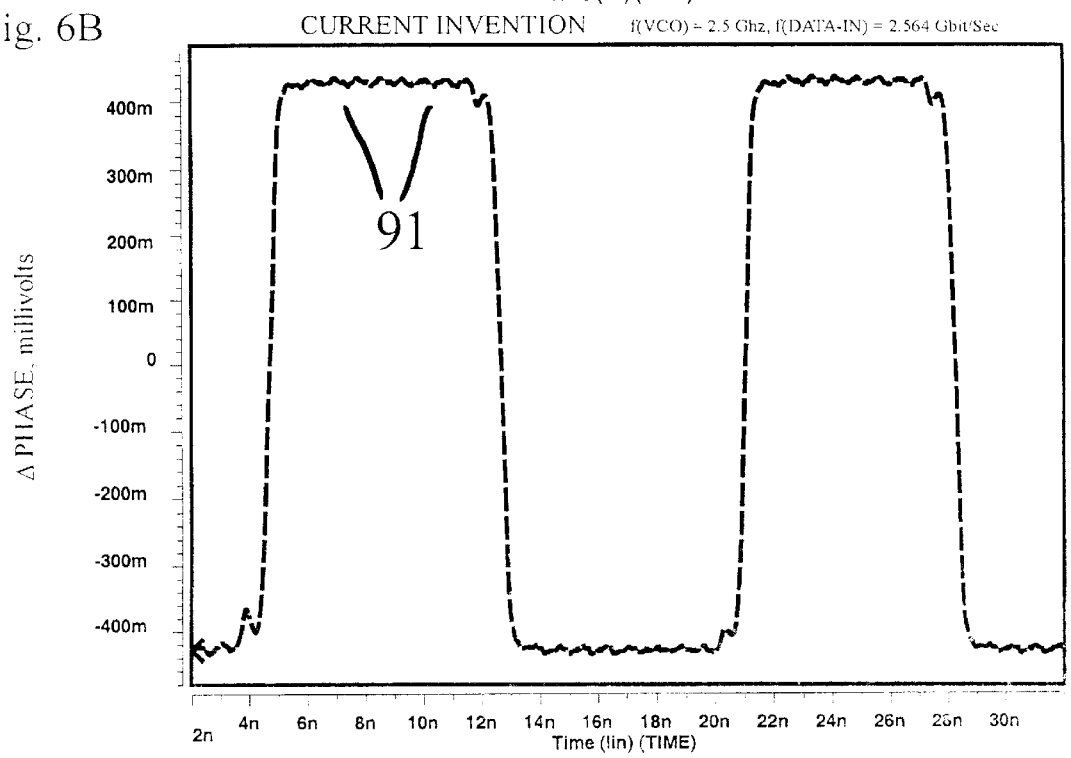

Another exemplary case of application of the current invention is illustrated from FIG. 4 to FIG. 6. FIG. 4 and FIG. 5A show a typical circuit architecture of an MS-DFF 70 with current mode switching and its associated logic functional block representation. In this exemplary case the supply voltage AVDD is shown to be 1.8 Volt although other values could be used just as well, for example 2.5 Volt. The input clock signals are CLK 71 and CLK 72. The input data signals are D 73 and $\underline{D}$ 74. The output data signals are Q 75 and $\underline{Q}$ 76. The various active NMOS transistors are designated as Nc1, Nc2, N1, N2, . . . , and N16. The four pull-up resistors are designated S3, S4, S13 and S14. For those skilled in the art, this type of circuitry is also manufacturable with a standard CMOS IC as well as a variety of nonstandard CMOS IC processes. In addition, if MS-DFF 70 can also be quantitatively designed to provide a high quality signal output at a high CLK frequency, such as 2.5 GHz for OC-48 communication, then MS-DFF 70 can also be used as one of the fundamental building blocks of a low cost optical switch for an optical network.

FIG. 5B is a logic functional block diagram of a typical BBPD 80 using the MS-DFF 70 from FIG. 4 as its logic building block. Specifically, the replicated logic building blocks are labeled as MS-DFF 81, MS-DFF 82 and MS-DFF 83. The input signals include VCO 85 and DATA-IN 86. The output signals include a PHASE 88. For those skilled in the art, it can be easily seen that the logic state of PHASE 88 will change according to the phase relationship of leading or lagging between the two input signals VCO 85 and DATA-IN 86. For convenience, the following differential signal is also defined:

$$\Delta PHASE = PHASE - \overline{PHASE}.$$

Like before, while using the same circuit architecture of an MS-DFF 70 with current mode switching, different quantitative design of BBPD 80 also yields quite different level of output signal quality especially for high VCO frequency as in optical communications. This is illustrated, in a manner similar to the first exemplary case of DIVIDER 60, with TABLE 2A, TABLE 2B, TABLE 2C and TABLE 2D.

TABLE 2A

Design of EECG for MS-DFF 81

| TYPICAL PRACTICE | | CURRENT INVENTION | |
|---|---|---|---|
| EECG | RATIO of EECG | EECG | RATIO of EECG |
| Nc1 | 60  | 1 | Nc1 | 60  | 1.00 |
| Nc2 | 60  | 1 | Nc2 | 60  | 1.00 |
| N1  | 120 | 2 | N1  | 200 | 3.33 |
| N2  | 120 | 2 | N2  | 200 | 3.33 |
| N11 | 120 | 2 | N11 | 200 | 3.33 |
| N12 | 120 | 2 | N12 | 200 | 3.33 |
| N3  | 120 | 2 | N3  | 200 | 3.33 |
| N4  | 120 | 2 | N4  | 200 | 3.33 |
| N5  | 120 | 2 | N5  | 320 | 5.33 |
| N6  | 120 | 2 | N6  | 320 | 5.33 |
| N13 | 120 | 2 | N13 | 200 | 3.33 |
| N14 | 120 | 2 | N14 | 200 | 3.33 |
| N15 | 120 | 2 | N15 | 320 | 5.33 |
| N16 | 120 | 2 | N16 | 320 | 5.33 |

TABLE 2B

Design of EECG for MS-DFF 82

| | TYPICAL PRACTICE | | CURRENT INVENTION | |
|---|---|---|---|---|
| | EECG | RATIO of EECG | EECG | RATIO of EECG |
| Nc1 | 60 | 1 | Nc1 | 60 | 1.00 |
| Nc2 | 60 | 1 | Nc2 | 60 | 1.00 |
| N1 | 120 | 2 | N1 | 200 | 3.33 |
| N2 | 120 | 2 | N2 | 200 | 3.33 |
| N11 | 120 | 2 | N11 | 200 | 3.33 |
| N12 | 120 | 2 | N12 | 200 | 3.33 |
| N3 | 120 | 2 | N3 | 320 | 5.33 |
| N4 | 120 | 2 | N4 | 320 | 5.33 |
| N5 | 120 | 2 | N5 | 200 | 3.33 |
| N6 | 120 | 2 | N6 | 200 | 3.33 |
| N13 | 120 | 2 | N13 | 320 | 5.33 |
| N14 | 120 | 2 | N14 | 320 | 5.33 |
| N15 | 120 | 2 | N15 | 200 | 3.33 |
| N16 | 120 | 2 | N16 | 200 | 3.33 |

TABLE 2C

Design of EECG for MS-DFF 83

| | TYPICAL PRACTICE | | CURRENT INVENTION | |
|---|---|---|---|---|
| | EECG | RATIO of EECG | EECG | RATIO of EECG |
| Nc1 | 60 | 1 | Nc1 | 60 | 1.00 |
| Nc2 | 60 | 1 | Nc2 | 60 | 1.00 |
| N1 | 120 | 2 | N1 | 100 | 1.67 |
| N2 | 120 | 2 | N2 | 100 | 1.67 |
| N11 | 120 | 2 | N11 | 100 | 1.67 |
| N12 | 120 | 2 | N12 | 100 | 1.67 |
| N3 | 120 | 2 | N3 | 100 | 1.67 |
| N4 | 120 | 2 | N4 | 100 | 1.67 |
| N5 | 120 | 2 | N5 | 1100 | 18.33 |
| N6 | 120 | 2 | N6 | 1100 | 18.33 |
| N13 | 120 | 2 | N13 | 100 | 1.67 |
| N14 | 120 | 2 | N14 | 100 | 1.67 |
| N15 | 120 | 2 | N15 | 1100 | 18.33 |
| N16 | 120 | 2 | N16 | 1100 | 18.33 |

TABLE 2D

Overview of Design of EECG for BBPD 80

| | TYPICAL PRACTICE | | | | CURRENT INVENTION | | |
|---|---|---|---|---|---|---|---|
| | RATIO of EECG MS-DFF1 | RATIO of EECG MS-DFF2 | RATIO of EECG MS-DFF3 | | RATIO of EECG MS-DFF1 | RATIO of EECG MS-DFF2 | RATIO of EECG MS-DFF3 |
| Nc1 | 1 | 1 | 1 | Nc1 | 1.00 | 1.00 | 1.00 |
| Nc2 | 1 | 1 | 1 | Nc2 | 1.00 | 1.00 | 1.00 |
| N1 | 2 | 2 | 2 | N1 | 3.33 | 3.33 | 1.67 |
| N2 | 2 | 2 | 2 | N2 | 3.33 | 3.33 | 1.67 |
| N11 | 2 | 2 | 2 | N11 | 3.33 | 3.33 | 1.67 |
| N12 | 2 | 2 | 2 | N12 | 3.33 | 3.33 | 1.67 |
| N3 | 2 | 2 | 2 | N3 | 3.33 | 5.33 | 1.67 |
| N4 | 2 | 2 | 2 | N4 | 3.33 | 5.33 | 1.67 |
| N5 | 2 | 2 | 2 | N5 | 5.33 | 3.33 | 18.33 |
| N6 | 2 | 2 | 2 | N6 | 5.33 | 3.33 | 18.33 |
| N13 | 2 | 2 | 2 | N13 | 3.33 | 5.33 | 1.67 |
| N14 | 2 | 2 | 2 | N14 | 3.33 | 5.33 | 1.67 |
| N15 | 2 | 2 | 2 | N15 | 5.33 | 3.33 | 18.33 |
| N16 | 2 | 2 | 2 | N16 | 5.33 | 3.33 | 18.33 |

Thus, while the quantitative design of all the individual building blocks of BBPD 80 is similar with typical practice, the quantitative design of each building block of BBPD 80 is individually adjusted with the current invention to achieve a much higher level of output signal quality in the presence of such deteriorating effects like output loading and interaction between functionally connected building blocks. Again, these effects tend to become especially pronounced at high VCO frequencies such as those for high speed optical communications presented here.

FIG. 6 compares the output signal ripple, APHASE, between a typical practice and the current invention BBPD 80 with a VCO 85 frequency f(CLK)=2.50 GHz. Notice that, with typical practice, the output signal has COMPLETELY failed its phase detector function with an ultra high frequency noise like output while the current invention output remains totally functional with a just visible signal ripple 91. This is obviously a drastic improvement.

FIG. 7A and FIG. 7B respectively illustrates a standard CMOS transistor structure and another nonstandard CMOS transistor structure, both known in the art, for the implementation of the Divide-by-16 divider of FIG. 2B and the BBPD of FIG. 5B. An NMOS FET 100 of FIG. 7A comprises a source 101, a drain 102 and a gate 103 that is dielectrically isolated from a channel connecting the source 101 and the drain 102. A Junction FET 110 of FIG. 7B has been mentioned by Schilling and Belove (see P. 134 to P. 137 of Electronic Circuits Discrete and Integrated—Donald Schilling and Charles Belove, published by McGraw-Hill Book Company in 1979). The Junction FET 110 comprises a source 111 a drain 112 and a gate 113 that is isolated, albeit with a small amount of reverse leakage current, with two diodes formed between two P-type gate regions 114 and an N-type channel 115 connecting the source 111 and the drain 112. To those skilled in the art, it should become obvious by now that the design method of systematic adjustment of each building block of electronic circuits, as illustrated with an SOI CMOS transistor structure, is equally applicable to a Junction FET or any other types of nonstandard FET structures as well.

Another important remark for the current invention is that, while the preferred embodiments are all illustrated with systematic adjustment of the active NMOS transistors of the individual building blocks, in reality the value of many or all of the associated passive circuit elements may be correspondingly adjusted as well. For example, in FIG. 1, the resistors R3, R4, R13 and R14 can all be individually adjusted for each building block of DIVIDER 60 in FIG. 2B although these adjustments are not illustrated for simplicity of explanation. For another example, in FIG. 4, the resistors S3, S4, S13 and S14 can all be individually adjusted for each building block of BBPD 80 in FIG. 5B as well although these adjustments are also not illustrated for the same reason.

As described with two exemplary cases, by systematically adjusting the circuit parameter of some or all of the components of the individual building blocks of an electronic circuit system, the corresponding quality of output signal is significantly improved. This is especially important for applications with high clock frequency such as in optical communications where such effects of output loading and interaction between functionally connected building blocks tend to become highly pronounced. The invention has been described using exemplary preferred embodiments. However, for those skilled in this field, the preferred embodiments can be easily adapted and modified to suit additional applications without departing from the spirit and scope of this invention. Some of the related applications include, but without limitation to, Optical communication at 2.5 Gbit/sec (OC48) and 10 Gbit/sec (OC192) data rate, Gigabit Ethernet, 10 Gigabit Ethernet, Blue Tooth technology (2.4 GHz) and wireless LAN (5.2 GHz). At such a high data rate, the hardware infrastructure for a multimedia information super highway is also enabled.

Thus, it is to be understood that the scope of the invention is not limited to the disclosed embodiments. On the contrary, it is intended to cover various modifications and similar arrangements based upon the same operating principle. The scope of the claims, therefore, should be accorded the broadest interpretations so as to encompass all such modifications and similar arrangements.

What is claimed are the following:

1. An integrated circuit for processing high speed signals, the integrated circuit comprising:

a first difference circuit receiving an input signal having a frequency, a second difference circuit coupled to the first difference circuit, each of the first and second difference circuits including a number of transistors, each of the transistors associated with a value of an Electrically Equivalent Channel Geometry (EECG) determining parasitic capacitances around the each of the transistors;

wherein a ratio for each of the transistors is determined to be the value of EECG of the each of the transistors over the value of the EECG of a chosen one of the transistors; and wherein the ratio for each of the transistors is adjusted in reference to the frequency of the input signal so that a first ratio set including the ratio for each of the transistors in the first difference circuit is different from a second ratio set including the ratio for each of the transistors in the second difference circuit.

2. The integrated circuit of claim 1, wherein the transistors inherently create various parasitic effects with the parasitic capacitances in the first and second difference circuits, respectively.

3. The integrated circuit of claim 1, wherein the parasitic effects are optimized by adjusting either one or both of the first and the second ratio set with reference to the frequency.

4. The integrated circuit of claim 3, wherein the parasitic effects are optimized to minimize possible artifacts in an output from the first or second difference circuit.

5. The integrated circuit of claim 2, wherein the parasitic effects are optimized by adjusting the ratio of the transistors in the first and second difference circuits with reference to the frequency so that possible artifacts in an output from the first or second difference circuit are minimized.

6. The integrated circuit of claim 2, wherein the transistors in both of the first and second difference circuits are CMOS transistors or Field Effect Transistors.

7. The integrated circuit of claim 2, wherein the transistors in both of the first and second difference circuits are fabricated with a standard CMOS structural substrate or a Silicon On Insulator (SOI) structural substrate.

8. The integrated circuit of claim 7, wherein lower parasitic capacitors in the SOI structural substrate are compensated by the parasitic capacitances formed by adjusted EECG for each of transistors in the first difference circuit and the second difference circuits, respectively.

9. An integrated circuit system for processing high speed signals, the integrated circuit system comprising:

a first building block receiving an input signal having a frequency and producing an output signal;

a second building block coupled to the first building block and receiving the output signal therefrom, wherein each of the two building blocks includes:

a number of transistors, each associated with a value of an Electrically Equivalent Channel Geometry (EECG) determining parasitic capacitances around the each of the transistors;

wherein a ratio for each of the transistors is determined to be the value of the EECG of each of the transistors over the value of the EECG of a chosen one of the transistors; and when the ratio for each of the transistors in the first building block is adjusted in reference to the frequency so that the parasitic capacitances are inherently and properly formed to create parasitic effects to minimize possible artifacts in the output from the first building block.

10. The integrated circuit system of claim 9, wherein the ratio for each of the transistors in the second building block is so adjusted that an output signal from the second building block has minimum artifacts introduced in the second building block.

11. The integrated circuit system of claim 9, wherein either one of the first and the second building blocks includes a first difference circuit coupled to a second difference circuit, each of the difference circuits including some of the transistors.

12. The integrated circuit system of claim 11, wherein the ratio for each of at least some of the transistors in the first building block is made differently from the ratio for each of the corresponding ones of the transistors in the second building block.

13. The integrated circuit of claim 9, wherein the transistors in both of the first and second difference circuits are fabricated with a standard CMOS structural substrate or a Silicon On Insulator (SOI) structural substrate.

14. The integrated circuit of claim 33, wherien lower parasitic capacitors in the SOI structural substrate are compensated by the parasitic capacitances formed by adjusted EECG for each of transistors in the first difference circuit and the second difference circuit, respectively.

15. A method for processing high speed signals, the method comprising:

determining a frequency in an input signal to be received at a first difference circuit, providing a second difference circuit coupled to the first difference circuit, each of the first and second difference circuits including a number of transistors, each of the transistors associated with a value of an Electrically Equivalent Channel Geometry (EECG) determining parasitic capacitances around the each of the transistors;

determining a ratio for each of the transistors, wherein the ratio is determined to be the value of the EECG of the each of the transistors over the value of the EECG of a chosen one of the transistors; and adjusting the ratio for each of the transistors in reference to the frequency so that the parasitic capacitances are inherently and properly formed.

16. The method of claim 15, wherein the transistors inherently create various parasitic effects with the parasitic capacitances in the first and second difference circuits, respectively.

17. The method of claim 16, wherein the parasitic effects are optimized by adjusting either one or both of the first and second ratio set with reference to the frequency.

18. The method of claim 17, wherein the parasitic effects are optimized to minimize possible artifacts in an output from the first or second difference circuit.

19. The method of claim 16, wherein the parasitic effects are optimized by adjusting the ratio for each of the transistors in the first and second difference circuits with reference to the frequency so that possible artifacts in an output from the first or second difference circuit are minimized.

20. The method of claim 16, wherein the transistors in both of the first and second difference circuits are CMOS transistors or Field Effect Transistors.

21. The method of claim 16, wherein the transistors in both of the first and second difference circuits are fabricated with a standard CMOS structural substrate or a Silicon On Insulator (SOI) structural substrate.

22. The method of claim 21, wherein lower parasitic capacitances in the SOI structural substrate are compensated by the parasitic capacitances formed by adjusted EECG for each of transistors in the first difference circuit and the second difference circuits, respectively.

* * * * *